United States Patent
Cornils et al.

(10) Patent No.: US 11,156,677 B2
(45) Date of Patent: Oct. 26, 2021

(54) SEMICONDUCTOR SENSOR STRUCTURE

(71) Applicant: TDK-MICRONAS GMBH, Freiburg (DE)

(72) Inventors: Martin Cornils, Freiburg (DE); Maria-Cristina Vecchi, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 112 days.

(21) Appl. No.: 16/696,323

(22) Filed: Nov. 26, 2019

(65) Prior Publication Data
US 2020/0166588 A1  May 28, 2020

(30) Foreign Application Priority Data

Nov. 22, 2018 (DE) ...................... 10 2018 009 162.8

(51) Int. Cl.
*G01R 33/07* (2006.01)
*G01R 33/02* (2006.01)
(Continued)

(52) U.S. Cl.
CPC .......... *G01R 33/07* (2013.01); *G01R 33/0206* (2013.01); *H01L 24/16* (2013.01);
(Continued)

(58) Field of Classification Search
CPC .......................... G01R 33/0206; G01R 33/072; G01R 15/202; G01R 33/07–077; H01L 24/16;
(Continued)

(56) References Cited

U.S. PATENT DOCUMENTS

| | | | |
|---|---|---|---|
| 9,494,661 B2 | 11/2016 | Paul et al. | |
| 2011/0205666 A1* | 8/2011 | Sasaki | G01R 33/1284 360/110 |

(Continued)

FOREIGN PATENT DOCUMENTS

DE    102013209514 A1    11/2014

OTHER PUBLICATIONS

Sander et al., "Isotropic 3D Silicon Hall Sensor," 28$^{th}$ IEEE Int'l Conf. on Micro Electric Mechanical Systems (MEMS), pp. 893-896 (Oct. 18, 2015).

(Continued)

*Primary Examiner* — Jonathan Han
(74) *Attorney, Agent, or Firm* — Muncy, Geissler, Olds & Lowe, P.C.

(57) ABSTRACT

A semiconductor sensor structure that includes a first and a second semiconductor wafer. The second semiconductor wafer has a substrate with integrated circuit with at least one metallic terminal contact, and the first semiconductor wafer has a semiconductor layer of a second conductivity type with a three-dimensional Hall sensor structure with a sensor region and at least three first metallic terminal contacts that are spaced apart from one another are formed on a front, and at least three second metallic terminal contacts that are spaced apart from one another are formed on a back. The terminal contacts are each formed on a highly doped semiconductor contact region of a second conductivity type and are arranged at an offset from the second terminal contacts in a projection perpendicular to the front.

14 Claims, 3 Drawing Sheets

(51) Int. Cl.
  *H01L 23/00* (2006.01)
  *H01L 27/22* (2006.01)
  *H01L 43/04* (2006.01)
  *H01L 43/06* (2006.01)
  *H01L 43/14* (2006.01)

(52) U.S. Cl.
  CPC .............. *H01L 27/22* (2013.01); *H01L 43/04* (2013.01); *H01L 43/065* (2013.01); *H01L 43/14* (2013.01); *H01L 2224/16147* (2013.01)

(58) Field of Classification Search
  CPC ......... H01L 27/22; H01L 43/04; H01L 43/14; H01L 2224/16147; H01L 43/06–065; H03B 15/00–006
  See application file for complete search history.

(56) References Cited

U.S. PATENT DOCUMENTS

| | | | |
|---|---|---|---|
| 2014/0151839 A1* | 6/2014 | Kang | H01L 33/0012 257/438 |
| 2017/0271399 A1* | 9/2017 | Lee | H01L 43/04 |
| 2019/0006416 A1* | 1/2019 | Lee | H01L 22/22 |
| 2021/0036054 A1* | 2/2021 | Gallagher | H01L 43/08 |

OTHER PUBLICATIONS

Kyynarainen et al., "A 3D micromechanical compass," Sensors and Actuators A: Physical, vol. 142, No. 2, pp. 561-568 (Feb. 26, 2008).
Sander, Christian et al: Isotropic 3D Silicon Hall Sensor. IN: 28$^{th}$ IEEE Int. Conference on MEMS, 2015, 893-896.
Sander, Christian et al: Monolithic Isotropic 3D Silicon Hall Sensor. In: Sensors and Actuators A, Vo. 247, 2016, 587-597.
Garrou, Philip et al: Handbook of 3D integration: Technology and applications of 3D integrated circuits. vol. 1. Weinheim: Wiley, 2008. 25-44 + 223-248. ISBN 978-527-32034-9.
Olson, Stephan et al: "Challenges in Thin Wafer Handling and Processing" In: ASMC, 2013, 62-65.

* cited by examiner

SEMICONDUCTOR SENSOR STRUCTURE

This nonprovisional application claims priority under 35 U.S.C. § 119(a) to German Patent Application No. 10 2018 009 162.8, which was filed in Germany on Nov. 26, 2018, and which is herein incorporated by reference.

BACKGROUND OF THE INVENTION

Field of the Invention

The present invention relates to a semiconductor sensor structure and a semiconductor sensor structure manufacturing method, wherein the semiconductor sensor structure includes a first semiconductor wafer and a second semiconductor wafer.

Description of the Background Art

Known from DE 10 2013 209 514 A1, which corresponds to U.S. Pat. No. 9,494,661, and which is incorporated herein by reference, is a three-dimensional Hall sensor for detecting a spatial magnetic field, wherein a semiconductor body has at least three electrode pairs, each electrode pair has a first terminal on a top of the semiconductor body and a second terminal on a bottom of the semiconductor body, and at least three pairs of electrode pairs form at least three four-contact structures that each permit the measurement of one spatial component of the magnetic field using the Hall effect.

A construction that includes a 3D Hall sensor structure on a printed circuit board is known from "Isotropic 3D Silicon Hall Sensor," C. Sander et al., 28th IEEE Int. conference on MEMS, 2015, 838-896 and "Monolithic Isotropic 3D Silicon Hall Sensor," C. Sander et al., Sensors and Actuators A, Col 247, 2016, 587-597.

Various methods for stacking ICs are known from "Handbook of 3D Integration: technology and applications of 3D integrated circuits," P. Garrou et al., Vol. 1, Weinheim: Wiley, 2008, pp. 25-44 and pp. 223-248, chapters 3 and 12, ISBN 978-527-32034-9, wherein the ICs are joined over their full area and are connected by means of through contact holes.

A method for providing a thin semiconductor layer with processed front and back is known from "Challenges in Thin Wafer Handling and Processing," S. Olson et al., ASMC, 2013, 62-65.

SUMMARY OF THE INVENTION

It is therefore an object of the present invention to provide a device that advances the state of the art.

According to an exemplary embodiment of the invention, a semiconductor sensor structure is provided that includes a first semiconductor wafer and a second semiconductor wafer, wherein the first semiconductor wafer has a semiconductor layer of a second conductivity type with a front and a back, and the second semiconductor wafer has a substrate layer formed on a back and an integrated circuit formed on a front with at least one metallic terminal contact formed on the front.

A three-dimensional Hall sensor structure with a sensor region is formed in the semiconductor layer of the first semiconductor wafer, wherein the sensor region is formed of a monolithic semiconductor body extending from the back to the front of the semiconductor layer.

At least three first metallic terminal contacts that are spaced apart from one another are formed on the front, and at least three second metallic terminal contacts that are spaced apart from one another are formed on the back.

In a projection perpendicular or substantially perpendicular to the front, the first terminal contacts are arranged at an offset from the second terminal contacts, and the first terminal contacts and the second terminal contacts each have a multifold rotational symmetry with respect to a symmetry axis at right angles to the front and to the back of the semiconductor body. Preferably it is a threefold symmetry.

Each first terminal contact and each second terminal contact is formed on a highly doped semiconductor contact region of a second conductivity type in each case.

The first terminal contacts can be arranged at an offset from the second terminal contacts by reason of the fact that the associated highly doped semiconductor contact regions of the first contact terminals are arranged at an offset from the associated highly doped semiconductor contact regions of the second terminal contacts.

The back of the first semiconductor wafer can be arranged above the front of the second semiconductor wafer, wherein at least one second terminal contact of the Hall sensor structure is arranged at least partially above a metallic terminal contact of the integrated circuit.

The metallic terminal contact of the integrated circuit can be integrally joined to the second terminal contact arranged above so that an operative electrical connection is established between the Hall sensor structure and the integrated circuit.

It should be noted that the term "isotropic Hall sensor" can be understood to mean a so-called 3D or three-dimensional Hall sensor structure that has a contiguous extent in all three spatial directions within the semiconductor body and wherein all three components of a magnetic field can be determined by means of the Hall sensor structure.

It is a matter of course that the formation of the highly doped semiconductor contact regions is preferably accomplished by means of an implantation step, wherein the dose is above $10e15$ $N/cm^3$.

Consequently, a 3D Hall sensor wafer and an additional wafer that includes an integrated circuit, e.g. using CMOS technology, are combined in the semiconductor sensor structure, wherein the two wafers or semiconductor wafers are integrally joined to one another only by means of the electrical contacts. Very sensitive Hall sensors can be manufactured economically and reliably by this means.

If the electrical contact between the terminal contacts of the integrated circuit and the second terminal contacts of the Hall sensor structure is implemented by means of contact bumps, so-called bumps, such as are known from flip-chip assembly, then with a suitable height of the contact bumps an air gap is formed between the front of the second semiconductor wafer and the back of the first semiconductor wafer, including the insulation layers and outside the contact regions.

The second terminal contacts of the Hall sensor structure can be routed out of the sensor region in a direction parallel to the back of the semiconductor layer, and the integral contacts between the second terminal contacts of the Hall sensor structure and the terminal contacts of the integrated circuit are arranged outside of the sensor region in a projection perpendicular to the back of the semiconductor layer.

The semiconductor sensor structure according to the invention represents a monolithic embodiment of an isotropic Hall sensor that can be manufactured using CMOS technology. The integration using circuit technology makes the device especially compact.

The semiconductor body can be electrically insulated from the rest of the semiconductor layer by means of a surrounding trench structure.

It is a matter of course in this case that the trench structure, which is also called a "trench," can be arranged to be spaced apart from the first terminal contacts and the second terminal contacts. It is also a matter of course that, even though the semiconductor body or the sensor structure is electrically insulated from the rest of the semiconductor layer, nevertheless the first terminal contacts and the second terminal contacts can be connected to the integrated circuit by means of conductive traces.

The depth of the trench structure can be designed such that the trench structure divides the semiconductor layer. In other words, the depth of the trench structure corresponds to the depth of the semiconductor layer. The trench structure can have an SiO2 layer surrounding the full surface on the side walls. A doped polysilicon is preferably formed between the side walls, wherein the polysilicon is usefully connected to a reference potential.

The semiconductor body can have a thickness of between 2 μm and 50 μm in the sensor region. Extremely preferably, the semiconductor body has a thickness of up to 100 μm in the sensor region. The thickness of the semiconductor body can be constant, at least within the sensor region. In particular, the surface at the front of the semiconductor body can be designed to be planar and nearly completely parallel or completely parallel to the surface at the bottom, at least in the area of the sensor region. It should be noted that "nearly completely" can be understood to mean a value, for example, above 90%.

In the sensor region, the ratio of thickness to length of the semiconductor body can include a range between 0.6 and 1.4 or a range between 0.8 and 12. Preferably, the ratio is 1.0.

A diameter of the first semiconductor wafer in a direction parallel to the front can have a ratio of 2:1 or 3:1 to a diameter of the second semiconductor wafer in the same direction.

The second terminal contacts of the Hall sensor structure can each include a highly doped polysilicon of a second conductivity type.

Further, all second terminal contacts of the Hall sensor structure can be arranged to each be at least partially above a metallic terminal contact of the integrated circuit, and in each case the metallic terminal contact of the integrated circuit is integrally joined to the second terminal contact of the Hall sensor structure arranged above so that an operative electrical connection is established between the Hall sensor structure and the integrated circuit.

The terminal contacts of the integrated circuit include contact bumps. Contact bumps, which are also called "bumps" and contain, e.g., gold, are known from flip-chip assembly, for example.

The semiconductor layer can have regions of a first conductivity type outside of the Hall sensor structure.

The first conductivity type can be p and the second conductivity type is n, or, alternatively, vice versa.

The second terminal contacts of the Hall sensor structure and at least a portion of the terminal contacts of the integrated circuit can each have a diameter of alternatively at least 10 μm or at least 20 μm or at least 80 μm or at least 150 μm or at least 400 μm.

According to the subject matter of the invention, an SaI semiconductor wafer structure manufacturing method with a first semiconductor wafer and a second semiconductor wafer of the above-described type includes at least the following process section areas:

In a first process section area, in a multiplicity of process steps, at least three highly doped semiconductor contact regions of the second conductivity type are produced by means of implantation on the back of a first semiconductor wafer having a semiconductor layer with a front and a back of a second conductivity type, and a second terminal contact is arranged on each semiconductor contact region.

In a second process section area, in a multiplicity of process steps, on a second semiconductor wafer having a substrate layer with a back and a front surface, an integrated circuit with at least one metallic terminal contact on the front is manufactured on the front. Preferably the second semiconductor wafer functions as a carrier.

In a third process section area, the first semiconductor wafer is arranged with the back above the front of the second semiconductor wafer, and at least one terminal contact of the integrated circuit is integrally joined to one of the second terminal contacts, so that upon joining, the front of the first semiconductor wafer becomes a top of the semiconductor sensor structure and the back of the second semiconductor wafer becomes a back of the semiconductor sensor structure, and the back of the first semiconductor wafer becomes a buried bottom surface after the joining.

In a fourth process section area, the front of the first semiconductor wafer is thinned, and in a multiplicity of process steps after the thinning at least three highly doped semiconductor contact regions of the second conductivity type are produced on the front by means of implantation, and a first terminal contact is arranged on each contact region, wherein, in a projection perpendicular to the front, the first terminal contacts or the associated highly doped semiconductor contact regions are offset from the second terminal contacts, and the first terminal contacts and the second terminal contacts each have a multifold rotational symmetry with respect to a symmetry axis at right angles to the front and to the back of the semiconductor body.

It is a matter of course that no time sequence is specified by the designations "first process section area," "second process section area," etc.

The fourth process section area can be carried out prior to the third process section area.

A trench structure that completely encloses the sensor region can be formed on the front of the semiconductor layer in a fifth process section area.

The trench structure can be arranged to be spaced apart from the first terminal contacts and the second terminal contacts, and that even though the sensor structure is electrically insulated from the rest of the semiconductor layer, nevertheless the first terminal contacts and the second terminal contacts can be connected to the integrated circuit by means of conductive traces.

A depth of the trench structure can be designed such that the trench structure divides the semiconductor layer. In other words, the depth of the trench structure can correspond to the depth of the semiconductor layer. The trench structure can have an SiO2 layer surrounding the full surface on the side walls. A doped polysilicon is preferably formed between the side walls, wherein the polysilicon is usefully connected to a reference potential.

The semiconductor body or the sensor region can be hexagonal in design. In an improvement, the semiconductor body has a different shape.

During the first process section area, a doped polysilicon is deposited and structured for connection to the second contact regions.

The structured polysilicon can be covered by means of a dielectric.

Parts of the first semiconductor wafer located outside of the sensor region can be detached in a sixth process section area.

A semiconductor layer with a thickness between 2 μm and 30 μm is formed by means of a CMP process in the fourth process section area. In an improvement, the thickness of the semiconductor layer formed is between 2 μm and 50 μm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
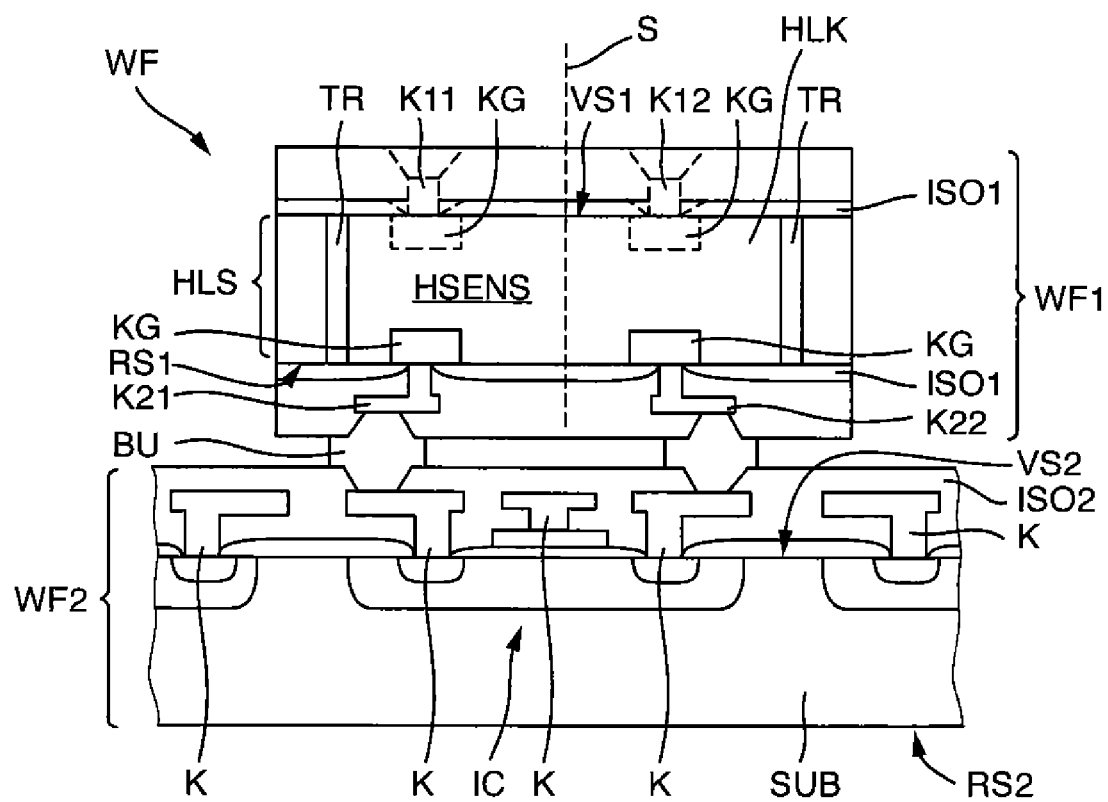
FIG. 1 shows a schematic sectional view of an SOI semiconductor structure, according to an exemplary embodiment.
Figure 2:
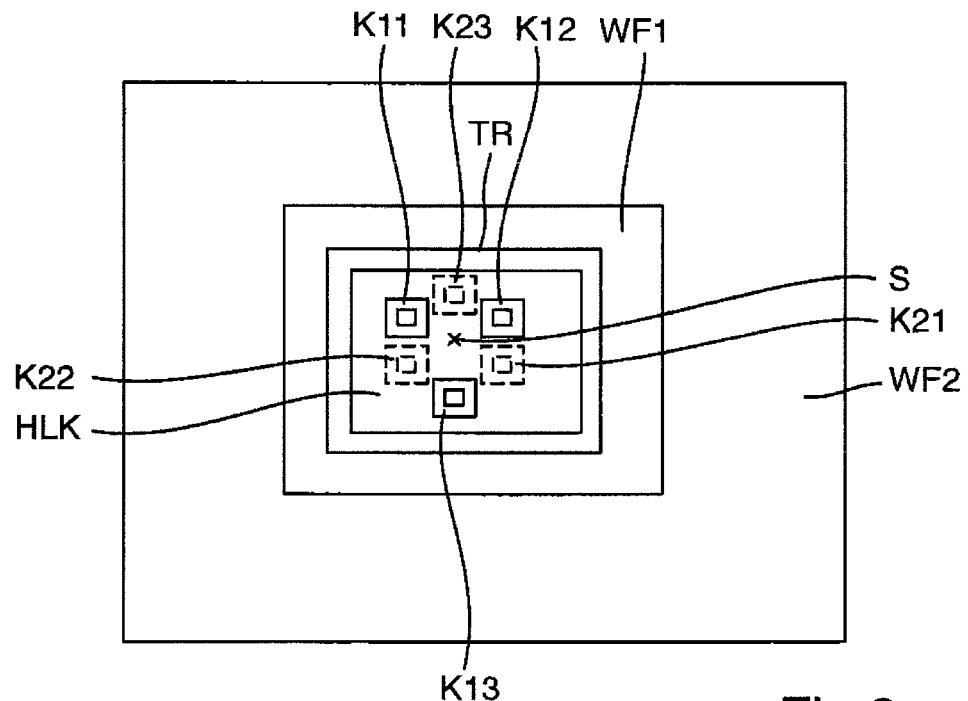
FIG. 2 shows a schematic top view of the SOI semiconductor structure.

The illustrations in FIGS. 1 and 2 show a sectional view and a top view, respectively, of an exemplary embodiment of a semiconductor sensor structure WF according to the invention composed of a first semiconductor wafer WF1 and a second semiconductor wafer WF2.

The second semiconductor wafer WF2 has a substrate layer SUB formed on a back RS2 and an integrated circuit IC, for example a transistor, formed on a front VS2 with multiple metallic terminal contacts K formed on the front VS2. The back RS2 of the substrate layer SUB forms a back of the semiconductor sensor structure WF. The front VS2 and the terminal contacts K are covered by an insulation layer ISO2, wherein three terminal contacts K are at least partially exposed.

The first semiconductor wafer WF1 is arranged above the front VS2 of the second semiconductor wafer WF2, and has a semiconductor layer HLS of a second conductivity type with a front VS1 and a back RS1. The back RS1 of the first semiconductor wafer and the front VS2 of the second semiconductor wafer WF2 face one another, and the front VS1 of the first semiconductor wafer WF1 forms at least part of a front of the semiconductor sensor structure.

Formed in the semiconductor layer HLS is a three-dimensional Hall sensor structure HSENS with a sensor region. The sensor region formed of a monolithic semiconductor body HLK extends from the back RS1 towards the front VS1 of the semiconductor layer HLS. The semiconductor body HLK is electrically insulated from the rest of the semiconductor layer HLS by means of a surrounding trench structure TR.

Formed on the front VS1 of the semiconductor layer HLS are three first metallic terminal contacts K11, K12, K13 that are spaced apart from one another, and three second metallic terminal contacts K21, K22, K23 that are spaced apart from one another are formed on the back RS1, wherein the first terminal contacts K11, K12, K13 are offset from the second terminal contacts K21, K22, K23 in a projection perpendicular to the front VS. In addition, the first terminal contacts K11, K12, K13 on the front VS1 and the second terminal contacts K21, K22, K23 on the back RS1 each have a threefold rotational symmetry with respect to a symmetry axis S standing at right angles to the front VS1 and to the back RS1 of the semiconductor body HLK.

Each first terminal contact K11, K12, K13 and each second terminal contact K21, K22, K23 is formed on a highly doped semiconductor contact region KG of a second conductivity type in each case. It is a matter of course that the highly doped semiconductor contact regions KG associated with the terminal contacts K11, K12, K13, K21, K22, and K23 are arranged to be rotated with respect to one another.

The front VS1 and the back RS1 are each covered by an insulation layer ISO1, wherein the insulation layers ISO1 partially enclose the first and second terminal contacts K11, K12, K13, K21, K22, K23.

The second terminal contacts K21, K22, K23 of the Hall sensor structure HSENS are each arranged at least partially above metallic terminal contacts K of the integrated circuit IC, wherein the metallic terminal contacts K of the integrated circuit IC are integrally joined by means of a contact bump BU, for example made of gold, to the second terminal contacts K21, K22, K23 arranged above so that an operative electrical connection is established between the Hall sensor structure HSENS and the integrated circuit IC.

It should be noted that it is only for reasons of clarity that the sensor region or the semiconductor body HLK has a square implementation in the present representation. Preferably, the semiconductor body HLK or the sensor region is hexagonal in design. In an improvement, the semiconductor body HLK has a different shape.

Figure 3:
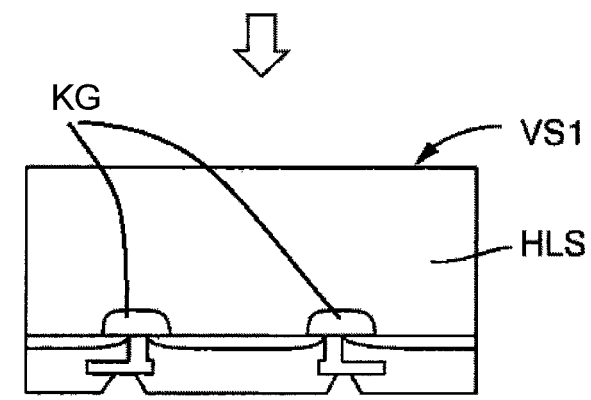
FIG. 3 shows a schematic view of a fourth process section area.
Figure 3:
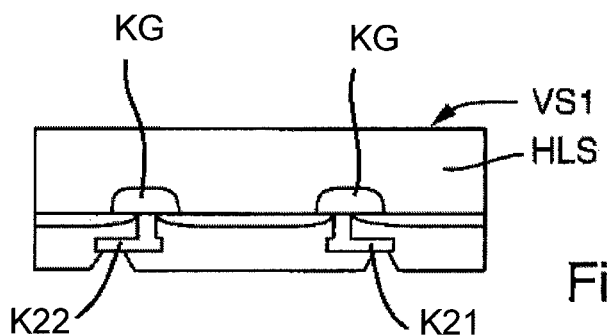

In the illustration in FIG. 3, an exemplary embodiment according to the invention of a fourth process section area is shown. Only the differences from the illustration in FIG. 1 are explained below.

After the manufacture of the highly doped semiconductor contact regions KG on the back RS1 of the first semiconductor wafer WF1 and the arrangement of the second terminal contacts K21, K22, K23 on the highly doped semiconductor contact regions KG as part of the first process section area, the semiconductor layer HLS of the first semiconductor wafer WF1 is thinned from the front VS1 in the fourth process section area. Only K21 and K22 are intersected by the cross section of FIG. 3.

Subsequently, highly doped contact regions KG are manufactured on the front VS1 in accordance with the first process section area and the first terminal contacts K11, K12, K13 are arranged.

Figure 4:
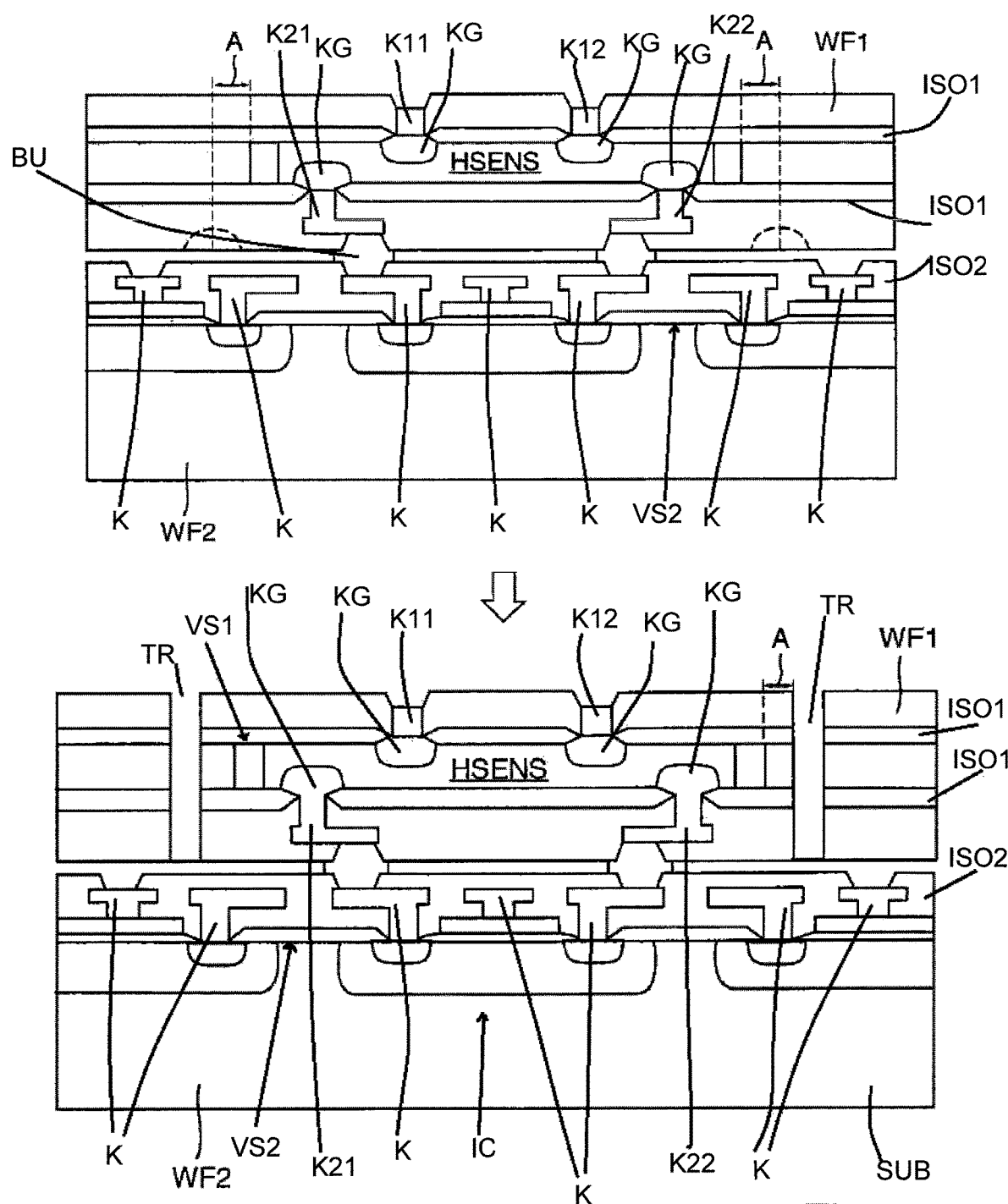
FIG. 4 shows a schematic view of a sixth process section area.

In the illustration in FIG. 4, an exemplary embodiment according to the invention of a sixth process section area is shown. Only the differences from the illustration in FIG. 1 are explained below.

A portion of the first semiconductor wafer WF1 located outside the sensor region delimited by the trench structure TR is detached at a distance A from the trench structure, for example by sawing. In order to ensure an adequate distance from the front VS2 of the second semiconductor wafer during the entire sawing process, the back RS1 of the first semiconductor wafer WF1 has a trench (shown in dashed lines) within the insulation layer ISO1 at the distance A from the trench structure, according to an alternative embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor sensor structure comprising:
a first semiconductor wafer; and
a second semiconductor wafer,
wherein the first semiconductor wafer has a semiconductor layer of a second conductivity type, the semiconductor layer having a first surface and a second surface, the first surface opposite the second surface,
wherein a three-dimensional Hall sensor structure with a sensor region is formed in the semiconductor layer of the first semiconductor wafer,
wherein the sensor region is formed of a monolithic semiconductor body extending from the second surface to the first surface of the semiconductor layer,
wherein at least three first metallic terminal contacts that are spaced apart from one another are formed on the first surface, and at least three second metallic terminal contacts that are spaced apart from one another are formed on the second surface,
wherein, in a projection extending perpendicular from the first surface, the at least three first metallic terminal contacts are arranged at an offset from the at least three second metallic terminal contacts,
wherein each of the at least three first metallic terminal contacts and each of the second terminal contacts are formed on a highly doped semiconductor contact region of the second conductivity type,
wherein the at least three first metallic terminal contacts and the second terminal contacts are each arranged with a multifold rotational symmetry with respect to a symmetry axis standing at right angles to the first surface and to the second surface of the semiconductor layer,
wherein a portion of the semiconductor layer is electrically insulated from the rest of the semiconductor layer of the first semiconductor wafer via a trench structure,
wherein the semiconductor layer has a thickness of between 2 µm and 50 µm or 100 µm in the sensor region,
wherein the second semiconductor wafer has a substrate layer formed on a third surface and an integrated circuit formed on a fourth surface with at least one metallic terminal contact that is formed on the fourth surface and includes a contact bump, the third surface being opposite the fourth surface,
wherein the second surface of the semiconductor layer is arranged above the fourth surface of the second semiconductor wafer,
wherein at least one particular terminal contact of the at least three second metallic terminal contacts of the Hall sensor structure is arranged at least partially above a metallic terminal contact of the integrated circuit,
wherein the metallic terminal contact of the integrated circuit is integrally joined via the contact bump to the at least one particular terminal contact arranged above so that an operative electrical connection is established between the Hall sensor structure and the integrated circuit, and wherein the contact bump has a height such that an air gap is formed around the contact bump between the second surface of the first semiconductor layer and the fourth surface of the second semiconductor wafer.

2. The semiconductor sensor structure according to claim 1, wherein the semiconductor layer of the sensor region has a ratio of thickness to length between 0.6 and 1.4 or a between 0.8 and 12.

3. The semiconductor sensor structure according to claim 1, wherein a diameter of the first semiconductor wafer in a direction parallel to the first surface has a ratio of 2:1 or 3:1 to a diameter of the second semiconductor wafer in the same direction.

4. The semiconductor sensor structure according to claim 1, wherein the at least three second metallic terminal contacts of the Hall sensor structure each include a highly doped polysilicon of the second conductivity type.

5. The semiconductor sensor structure according to claim 1, wherein all of the at least three second metallic terminal contacts of the Hall sensor structure are arranged to each be at least partially above a metallic terminal contact of the integrated circuit, and the metallic terminal contact of the integrated circuit is integrally joined to the at least one particular terminal contact of the Hall sensor structure arranged above so that an operative electrical connection is established between the Hall sensor structure and the integrated circuit.

6. The semiconductor sensor structure according to claim 1, wherein the semiconductor layer has at least one region of a first conductivity type outside of the Hall sensor structure.

7. The semiconductor sensor structure according to claim 6, wherein the first conductivity type is p and the second conductivity type is n, or vice versa.

8. The semiconductor sensor structure according to claim 1, wherein the at least three second metallic terminal contacts of the Hall sensor structure and the metallic terminal contact of the integrated circuit each have a diameter of at least 10 µm or at least 20 µm or at least 80 µm.

9. A semiconductor structure manufacturing method for manufacturing a semiconductor sensor structure comprising a first semiconductor wafer and a second semiconductor wafer, the method comprising:
producing, in a first process section area, at least three highly doped semiconductor contact regions of a second conductivity type by implantation on a first surface of the first semiconductor wafer having a semiconductor layer with a second surface and a third surface, the semiconductor layer being of the second conductivity type, the second surface being opposite the third surface, wherein a second terminal contact is arranged on each of the at least three highly doped semiconductor contact regions;
producing, in a second process section area, on the second semiconductor wafer, which has a substrate layer with a fourth surface and a fifth surface, the fourth surface opposite the fifth surface, an integrated circuit with at least one metallic terminal contact on a fifth surface that includes a contact bump;
arranging, in a third process section area, the first semiconductor wafer with the first surface above the fifth surface of the substrate layer of the second semiconductor wafer, and the at least one metallic terminal contact of the integrated circuit is integrally joined to one of the second terminal contacts via the contact bump, so that upon joining, a sixth surface opposite the first surface of the first semiconductor wafer becomes a top of the semiconductor sensor structure and the fourth surface of the substrate layer of the second semiconductor wafer becomes a back of the semiconductor sensor structure, the first surface of the first semiconductor wafer becomes a buried bottom surface after the joining, and via a height of the contact bump, an air gap is formed around the contact bump between the first surface of the first semiconductor wafer and the fifth surface of the substrate layer of the second semiconductor wafer;

thinning, in a fourth process section area, the sixth surface of the first semiconductor wafer, and after the thinning, at least three highly doped additional semiconductor contact regions of the second conductivity type are produced on the sixth surface by implantation, and a first terminal contact is arranged on each of the at least three highly doped additional semiconductor contact regions, wherein, in a projection extending perpendicular to the sixth surface, the first terminal contacts are offset from the second terminal contacts, and the first terminal contacts and the second terminal contacts are each arranged with a multifold rotational symmetry to one another with respect to a symmetry axis at right angles to the second surface and the third surface of the semiconductor layer; and forming on the second surface of the semiconductor layer in a fifth process section area, a trench structure that completely encloses a sensor region and electrically insulates the sensor region from the rest of the semiconductor layer.

10. The semiconductor structure manufacturing method according to claim 9, wherein the fourth process section area is carried out prior to the third process section area.

11. The semiconductor structure manufacturing method according to claim 9, wherein, during the first process section area, a doped polysilicon is deposited and structured for connection to the second terminal contacts.

12. The semiconductor structure manufacturing method according to claim 11, wherein the structured polysilicon is covered by a dielectric.

13. The semiconductor structure manufacturing method according to claim 9, wherein portions of the first semiconductor wafer located outside of the sensor region are detached in a sixth process section area.

14. The semiconductor structure manufacturing method according to claim 9, wherein semiconductor layer with a thickness between 2 µm and 30 µm is formed by a chemical mechanical planarization process in the fourth process section area.

* * * * *